United States Patent [19]
Bald et al.

[11] Patent Number: 6,011,398
[45] Date of Patent: Jan. 4, 2000

[54] CURRENT-LEAKAGE TESTER

[75] Inventors: Roger A. Bald, Round Lake Beach, Ill.; Pin-Yi Chen, Taipei; Chih Ping Liang, Hsinchu, both of Taiwan

[73] Assignee: Associated Research, Inc., Lake Forest, Ill.

[21] Appl. No.: 09/064,602

[22] Filed: Apr. 23, 1998

[51] Int. Cl.[7] .................................................. G01R 31/02
[52] U.S. Cl. .......................... 324/511; 324/508; 324/510; 324/602
[58] Field of Search ................................. 324/508, 509, 324/510, 511, 522, 602, 609; 340/635, 647, 664

[56] References Cited

U.S. PATENT DOCUMENTS

| | | | |
|---|---|---|---|
| 3,368,146 | 2/1968 | Regan et al. | 324/511 |
| 3,908,286 | 9/1975 | Dean et al. | 324/509 X |
| 4,084,134 | 4/1978 | Nagano | 324/133 |
| 4,292,585 | 9/1981 | Charette | 324/510 |
| 4,558,309 | 12/1985 | Antonevich | 340/649 |
| 4,642,554 | 2/1987 | Aucoin | 324/511 |
| 4,672,309 | 6/1987 | Gandhi | 324/95 |
| 5,461,317 | 10/1995 | Winter | 324/511 |
| 5,469,063 | 11/1995 | Winter | 324/508 |
| 5,548,501 | 8/1996 | Chen | 363/21 |
| 5,610,526 | 3/1997 | Aslan et al. | 324/522 |
| 5,631,565 | 5/1997 | Winter | 324/511 |

OTHER PUBLICATIONS

John Wharton, "Using the Intel MCS–51 ®Boolean Processing Capabilities", "INTEL", Apr. 1980.

*Primary Examiner*—Glenn W. Brown
*Attorney, Agent, or Firm*—Bacon & Thomas

[57] ABSTRACT

A leakage tester includes multiple circuits capable of simulating the impedance of the human body to electrical current under a variety of conditions, and in which the multiple circuits can be selected using a single menu-based operator interface for testing both normal-line and single-fault conditions such as open-neutral, reversed-line, and open-ground conditions, as well as for performing additional types of safety compliance tests including dielectric withstand, insulation resistance, and ground bond or continuity tests, in any sequence.

21 Claims, 17 Drawing Sheets

CURRENT-LEAKAGE TESTER

BACKGROUND OF THE INVENTION

1. Field of the Invention

The present invention relates to electrical safety compliance test equipment, and more particularly to an automated line leakage tester capable of performing a plurality of different line leakage and other types of safety compliance tests.

2. Description of Related Art

Line leakage testing measures the amount of current to which a user of an electrical device is exposed during normal operation of the device. In general, the amount of such leakage current depends on the design of the device, and even a non-defective device may have some leakage current. However, if the leakage current is below a threshold, the leakage current is imperceptible and poses no threat.

In contrast, two other types of electrical safety compliance tests measure conditions which are caused by, or which can cause, catastrophic failure of a product, namely ground circuit and insulation integrity. These tests are to be distinguished from line leakage tests in that they generally require application of voltages or currents other than the normal operating voltages and currents for the device be applied. An example of a test instrument capable of carrying out both ground circuit and insulation tests is found in copending U.S. patent application Ser. No. 09/033,958, filed Mar. 3, 1993, herein incorporated by reference.

The present invention concerns line leakage testing, and in particular the problem of meeting different standards for the tests. In addition, the present invention concerns the problem of combining a line leakage tester with a test instrument such as the one described in the above-cited copending application through external links.

The reason for the different line leakage testing standards is that the amount of leakage current that will pass through a person using a device can only be approximated because the effect of the human body on the current, i.e., the impedance of the body, can only be approximated, and different jurisdictions have chosen different models of the electrical characteristics of the body to develop their standards. In order to meet a standard for a particular jurisdiction, or intended use of a product, the circuitry through which the current to be measured is passed must correspond to the model used in the standard. This is not just a matter of setting different acceptable current thresholds, but of using completely different test circuits.

Generally, line leakage testing is carried out by applying normal line power to the device being tested, touching a probe to the device, and measuring the current present in a circuit connected between the probe and a reference. The circuit connected between the probe and the reference is intended to approximate a person touching both the device and a surface corresponding to the reference, and is referred to as a human equivalent circuit. It is these human equivalent circuits that must be varied in order to meet the different line leakage standards.

In addition to requiring different human equivalent circuits, most line leakage test standards include provision for testing leakage under a variety of power line conditions that might occur during use of a product, including open ground and neutral and reversed polarity conditions, and most standard-setting organizations also require products to be subjects to ground and insulation tests in addition to line leakage tests.

A schematic of a circuit recommended by UL for making the measurement is shown in FIG. 1, which is taken from the publication "A Basic Guide To Product Safety Testing" published by Associated Research, Inc. The circuit includes a line input 1 for supplying power to a receptacle 2 into which the device under test (DUT) 3 is plugged upon positioning on an insulating table or platform 4. An AC volt meter 5 monitors the input current while leakage current is measured by a volt meter 6 across a human equivalent circuit 7. A switch Si permits either an open neutral or closed neutral test configuration, while switch S2 reverses the polarity of the power connections to the receptacle, and switch S3 connects the power circuit to the third wire ground prong of the receptacle.

If all persons perceived current in the same way, there would be no need for multiple line leakage current test capabilities in a single instrument, and a single circuit corresponding to circuit 7 shown in FIG. 1 would be adequate. However, the impedance of a person to the leakage current depends on a number of factors, including the size of the person, moisture on the person's skin, and whether the person is standing or lying down. Because these conditions can only be approximated, different agencies have selected different models as best approximating the electrical characteristics of a user of an electrical device.

Examples of different human equivalent circuits are shown in FIGS. 2A–2E. In addition to the illustrated circuits, organizations such as the Underwriter's Laboratories (UL), Canadian Standards Association (CSA), Association of German Engineers (VDE), International Electrotechnical Commission (IEC), British Standards Institution (BSI), and Japanese Standards Association (JIS), and other private and governmental testing agencies have selected a variety of other human equivalent circuits for testing the maximum amount of current that may leak from a non-defective product operating at its normal line voltage. Any product that is to be sold in jurisdictions covered by more than one of these organizations must be tested using multiple different human equivalent circuits.

Furthermore, even within a single jurisdiction, different electrical products may have different line leakage standards to account for the intended use or intended users of the products. For example, products intended for children may require different equivalent circuits then those intended for adults, while products intended for persons in hospital beds may require different human equivalent circuits than similar products used outside a hospital, as evidenced by the differences between FIG. 2D, which is a common standard for non-patient care equipment, and FIG. 2E, which shows the UL standard for patient care equipment.

The present invention is a line leakage test instrument that enables a variety of different products to meet different test standards by including the capability of switching between multiple human equivalent leakage test impedance circuits, under multiple power line conditions, including open-neutral, open-ground, and reversed polarity, and in addition offers multiple probe configurations including probe-to-probe and ground-to-neutral or probe-to-neutral configurations.

Rather than simply adding circuits to the conventional single impedance circuit tester, however, the present invention also addresses various additional problems related to the inclusion of multiple test circuits, including the problem of ease-of-use, safety, cost, and reliability, and furthermore provides external link capabilities so that the same test set-up can be used not only to perform multiple line leakage tests, but also other types of safety compliance tests, including tests for defects in the ground circuit or insulation of an electrical product.

The external link capability greatly increases the versatility of the line tester, but also increases the hazards because each type of test requires different power and test connections. Electrical product ground circuit testing standards generally require currents sufficient to enable measurement of the impedance of the ground circuit (often referred to as "ground bond" testing), while tests of insulation integrity require a voltage at least sufficient to measure the resistance across two electrically isolated points in a device (insulation resistance testing), or to stress the insulation in the device in order to measure the resulting leakage current (dielectric withstand or hipot testing). In order to minimize these risks, it is preferable to enable centralized control of all tests, which in the case of separate test instruments is best carried out by providing for remote computer control of the instruments.

In addition to providing a menu-driven interface which permits the operator to program the instrument to set parameters for a sequence of different types of tests, either remotely from a central computer or via the front panel of the instrument, using menus to guide selection of the parameters, and therefore minimize operator error, the present invention also provides interlocks which prevent unsafe electrical connections from being made and which shuts down the test equipment not only upon detection of an over-current at the outputs of the instrument, but also upon detection of an overvoltage in the power supply.

Furthermore, even though the instrument does not include internal power supply circuits for tests other than line leakage tests, but merely allows external connection of testing equipment for the other types of tests, switching to the external connection circuitry is controlled through the same operator interface that controls the line leakage tests, including the selection of human equivalent test circuits, and the external connection circuitry is fully integrated into the safety interlock and overload protection circuitry so as to minimize hazards to the operator.

SUMMARY OF THE INVENTION

It is a first objective of the invention to provide a current leakage tester that includes circuitry capable of simulating the impedance of the human body to electrical current under multiple UL, IEC, and other agency standards.

It is a second objective of the invention to provide a current leakage tester that includes multiple circuits capable of simulating the impedance of the human body to electrical current under a variety of conditions, and in which the multiple circuits can be selected using a single menu-based operator interface.

It is a third objective of the invention to provide a current leakage tester that includes circuitry capable not only of simulating the impedance of the human body to electrical current under multiple existing standards, but also that allows the tester to connect an external measuring device as specifications change or new specifications are introduced.

It is a fourth objective of the invention to provide a current leakage tester having multiple human equivalent impedance circuits that also includes a switching matrix for testing both normal-line and single-fault conditions such as open-neutral, reversed-line, and open-ground conditions, and that can be programmed to test for these conditions in any sequence, using a simple menu-driven interface that also controls the selection of human equivalent circuits.

It is a fifth objective of the invention to provide a line leakage tester having multiple human equivalent impedance circuits and multiple power input configurations that also includes external inputs for connecting the device being tested to high voltage or current sources in order to carry out dielectric withstand or ground bond tests in addition to the line leakage tests, using the same user interface that is used to select the human equivalent circuits, including automated protective interlocks, and the possibility of switching the external links by remote control so that a central computer can be used to control both the line leakage tests and testing via the external power source if an appropriate external power source, such as the one described in the above-cited copending application, is used.

It is a sixth objective of the invention to provide an automated line leakage tester having multiple human equivalent impedance circuits, multiple power connection configurations, and external links with safety interlocks to other types of test equipment, and yet which fits within the footprint of a conventional rack-mounted line leakage tester.

These objectives are achieved, in accordance with the principles of a preferred embodiment of the invention, by providing a line leakage tester that includes a probe arranged to contact the electrical device, a measurement device including a plurality of different human equivalent impedance circuits, and a switching arrangement for selectively connecting individual ones of the different impedance circuits between the probe and an electrical reference so as to measure leakage current between the probe and the reference when the probe is placed in contact with the electrical device.

According to an especially preferred embodiment of the invention, the line leakage tester includes a switching matrix for selectively disconnecting a neutral output to the electrical device from a neutral line of the power input, for selectively connecting the neutral output to ground, and for reversing a polarity between the line input and the output to the electrical device being tested, the switching matrix being controllable via a simple menu-driven interface that also controls selection of the human equivalent circuit.

In addition, the line leakage tester of the invention preferably includes an external link circuit which includes a high voltage input selectively connectable to the line or neutral power outputs for supplying a voltage higher than the normal operating voltage of the electrical device in order to stress the operating circuits of the device, and/or a current output switchably connected to supply current to ground circuit of the device, the switches being controlled via the interface that also controls selection of the human equivalent circuit and the switching matrix, with safety interlocks to prevent connection of the line leakage test probe during a high voltage test.

Furthermore, the line leakage tester of the invention preferably also includes a second probe, and switches for selectively connecting the human equivalent circuit between the first and second probes, between ground and the input line neutral, or between one of the probes and the input line neutral, and in which the probe configuration switches are also controlled by the interface that also controls selection of the human equivalent circuit, configuration of the power connections to the electrical device, and switching between internal and external inputs, so that the line leakage tester of the invention can provide pre-programmed test sequences for multiple line leakage human equivalent circuits and probe configurations, multiple power line connection conditions, and even multiple types of safety compliance tests such as dielectric withstand, insulation resistance, and ground bond or continuity tests.

Finally, the present invention preferably also includes a remote interface, including advanced data bus communications capabilities, which enable the test instrument of the present invention to be commonly controlled with another correspondingly equipped test instrument connected to the external links, so as to provide a programmable, completely automated testing system capable of providing all necessary or desired electrical safety compliance tests in any sequence with minimal operator intervention.

DETAILED DESCRIPTION OF THE PREFERRED EMBODIMENTS

Figure 3:
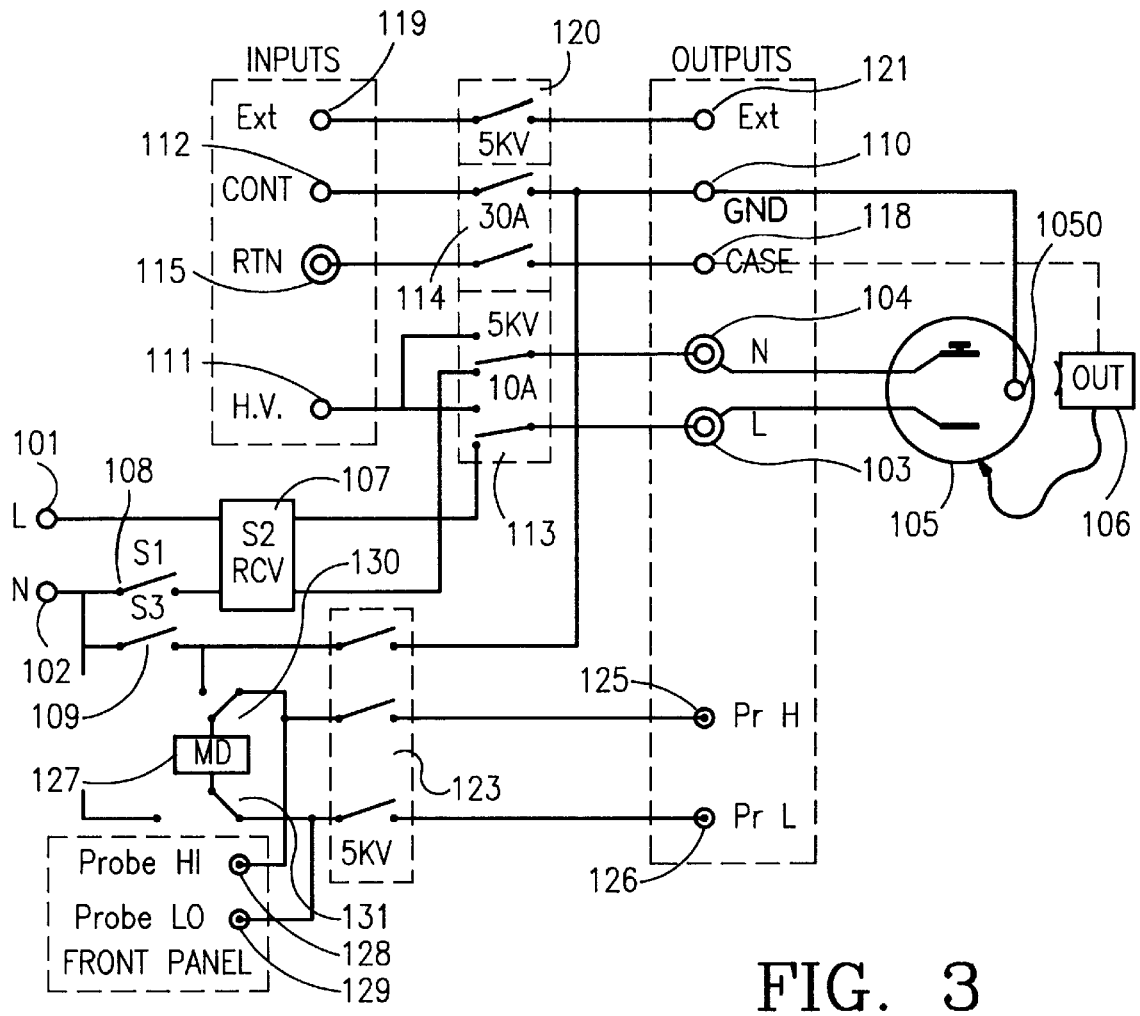
FIG. 3 is a schematic circuit diagram of the power circuit used by the line leakage tester of the preferred embodiment of the invention.
Figure 4:
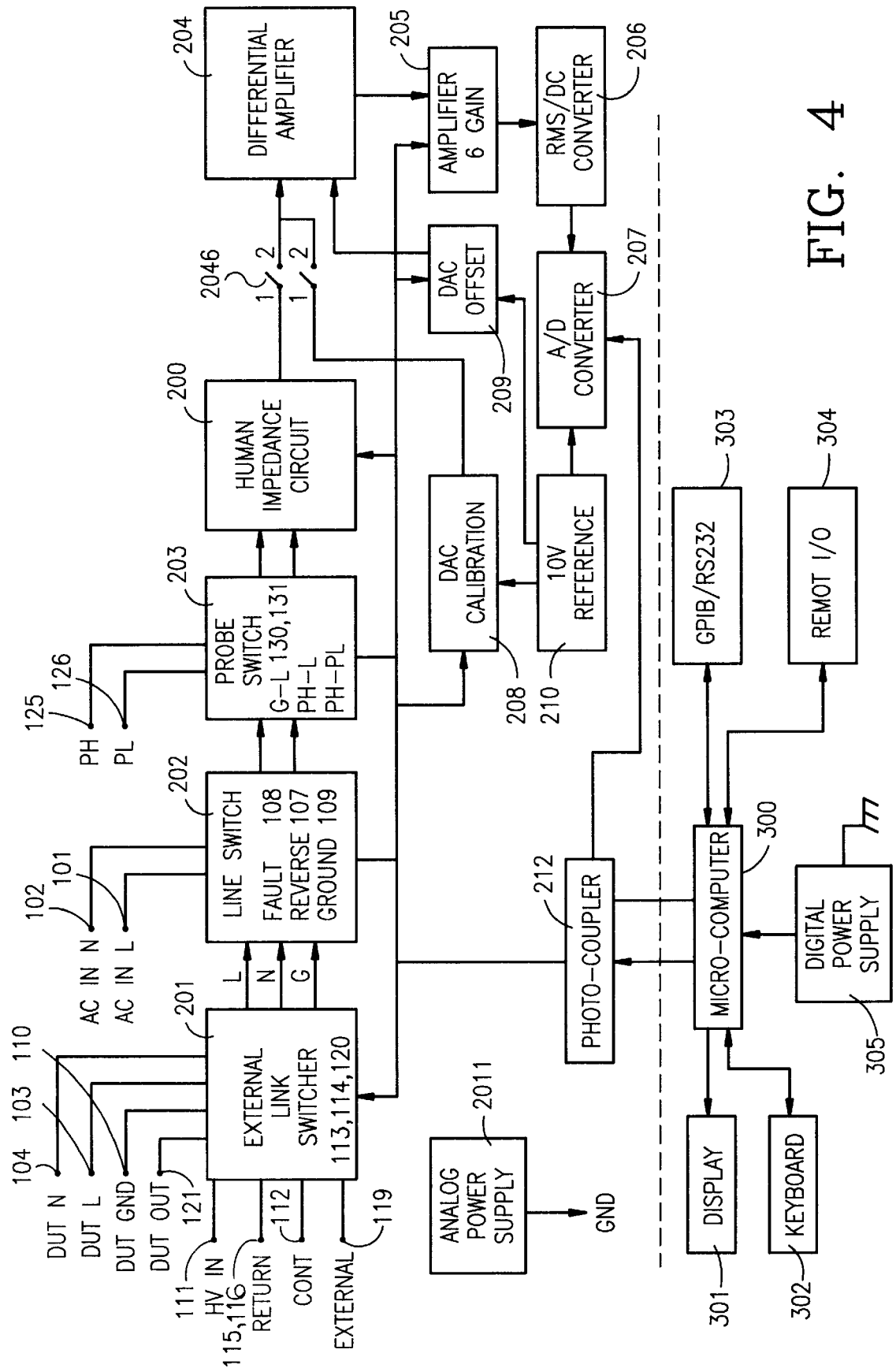
FIG. 4 is a functional block diagram showing the overall arrangement of the preferred line leakage tester.
Figure 5:
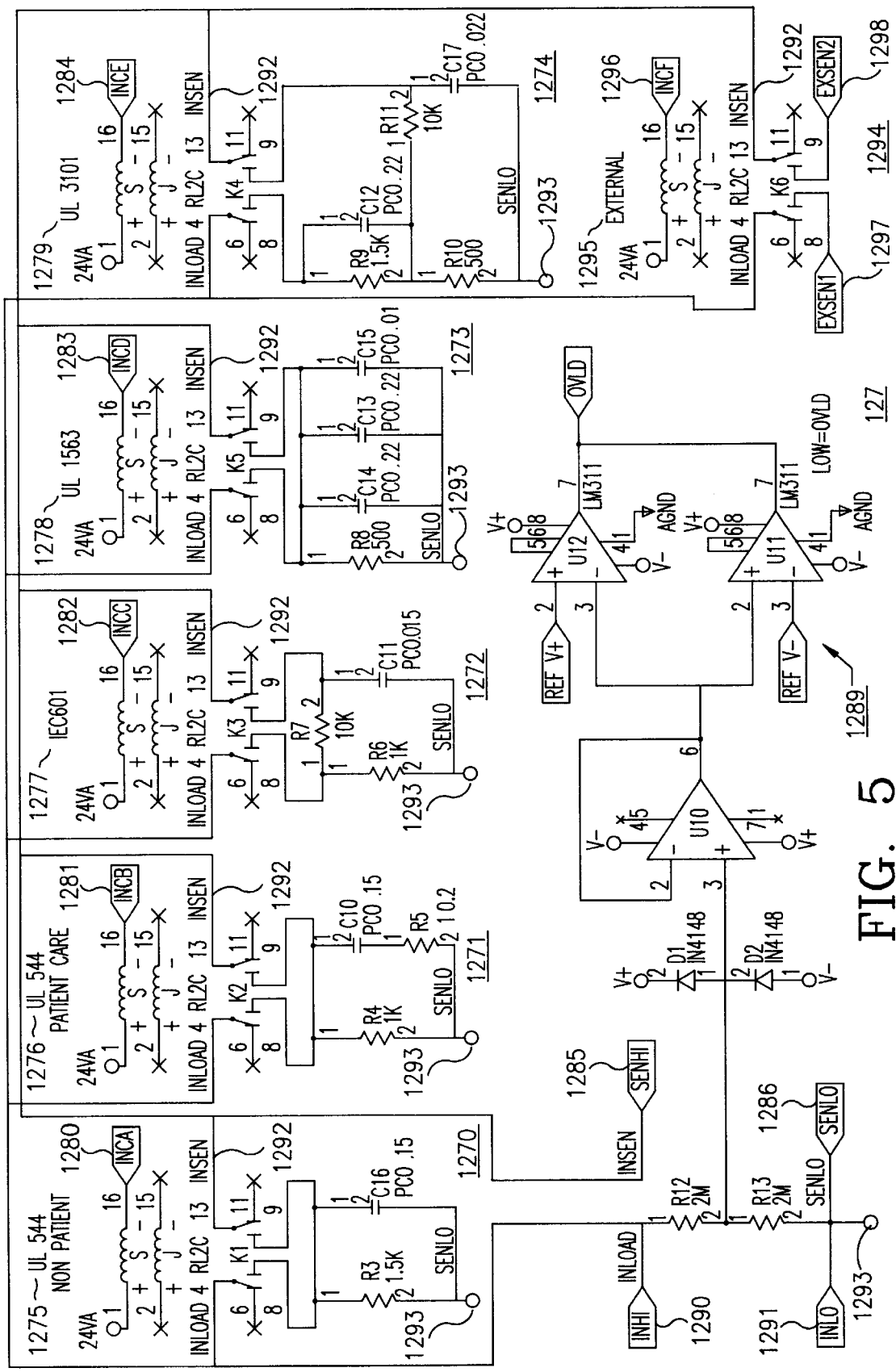
FIG. 5 is a schematic diagram showing a measurement device human equivalent circuit configuration arranged according to the principles of the preferred embodiment of the invention.

The general organization of this detailed description is as follows: First, a preferred layout of a circuit for configuring the line leakage tester of the invention to perform a variety of different line leakage tests is described in connection with FIG. 3, the circuit of FIG. 3 including a measurement device 127 made up of a number of different human equivalent circuits, a switching matrix for switching between different power connection conditions, switchable connections to external power sources, and switches for selecting different probe configurations. The overall arrangement of the main functional elements of the preferred line leakage tester are described in connection with FIG. 4, and the circuit for selecting the different human equivalent circuits is then described in detail in connection with FIG. 5. Additional details of various analog and digital processing and control circuits which may be used in connection with the circuits shown in FIGS. 3–5 are described in connection with FIGS. 6–17 for the purpose of enabling those skilled in the art to make and use the invention and to show the best mode of practicing the invention, and an exemplary layout of the front and rear panels of the preferred line leakage tester is described in connection with FIGS. 18A and 18B.

While specific implementations of the circuitry of the preferred embodiment of the invention are illustrated in great detail in the accompanying drawings, however, so that anyone skilled in the art can implement the invention based on the specific circuit elements and values shown in those drawings, it should be appreciated by those skilled in the art that the drawings contain numerous aspects which may be freely varied within the scope of the invention, and that the invention should not be limited in any way by the disclosure of such details.

For example, while many of the circuits shown in the drawings are identified by part numbers or particular values, which can be used to obtain the parts from manufacturers using catalogs available from the manufacturers, and such sources as the "Chip Directory" available on the World Wide Web at http:\\www.acl.co.uk, such parts may have many equivalents, and substitution of the equivalent circuits is intended to be included within the scope of the invention. Such circuits as the power supply circuits, remote interface and bus interface circuits, and LCD display and buzzer controllers are all standard or depend on the type of controller used, and one skilled in the art would, as a matter of routine, be able to make changes to the illustrated circuitry without departing from the basic principles of the invention.

Because the functions of the individual resistors, diodes, op amps, and other illustrated circuit elements are in general apparent from the illustrations and will be readily understood by those skilled in the art, detailed explanations are only given with respect to elements that specifically illustrate or implement the principles of the invention, or to generally indicate the principal components of other portions of the preferred embodiment. The skilled artisan is invited to view the specific component values and part numbers shown in the drawings as providing but one operable example of an instrument which incorporates the broader principles of the invention.

These principles will now be described in connection with FIGS. 3–17, starting with FIG. 3, which shows a preferred embodiment in which power for a line leakage test is provided by line voltage input 101 and neutral input 102, and supplied to a device under test (DUT) 106 via a corresponding line voltage output 103 and neutral output 104 connected to a power receptacle 105, the device under test being plugged into the power receptacle.

In the illustrated embodiment, power receptacle 105 includes line and neutral contacts and also a third wire ground prong 1050, although those skilled in the art will appreciate that the arrangement of contacts in the power receptacle 105 will depend on the type of plug being used, with different versions or adapters being provided for U.S. products and products intended for use in other countries.

Figure 1:
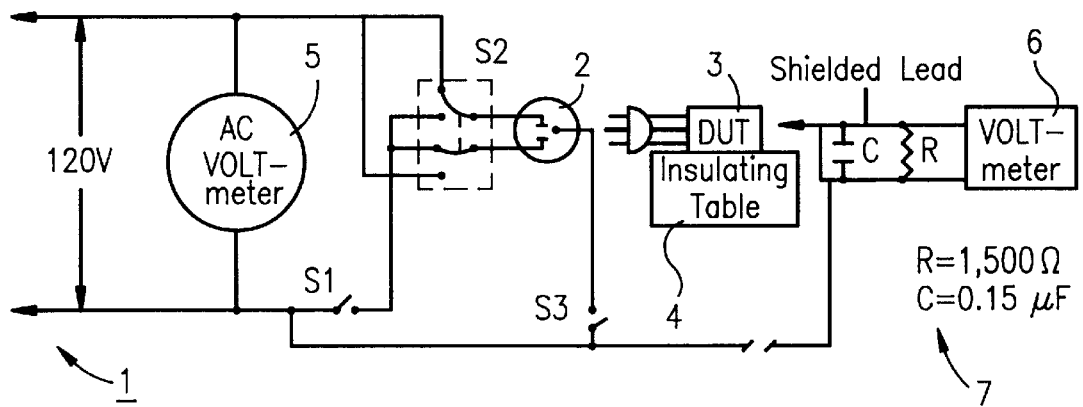
FIG. 1 is a schematic circuit diagram of a conventional line leakage tester.
Figure 2C:
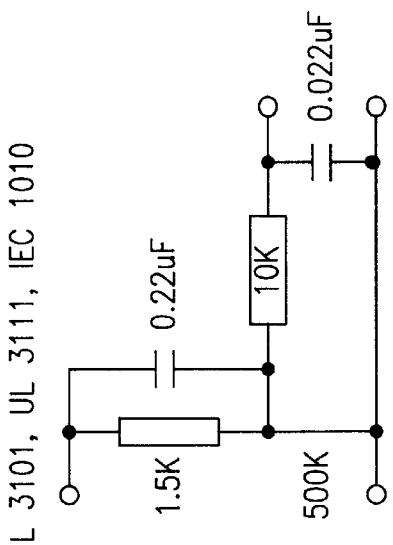
FIGS. 2A–2E are schematic diagrams of various human equivalent circuit standards.
Figure 2B:
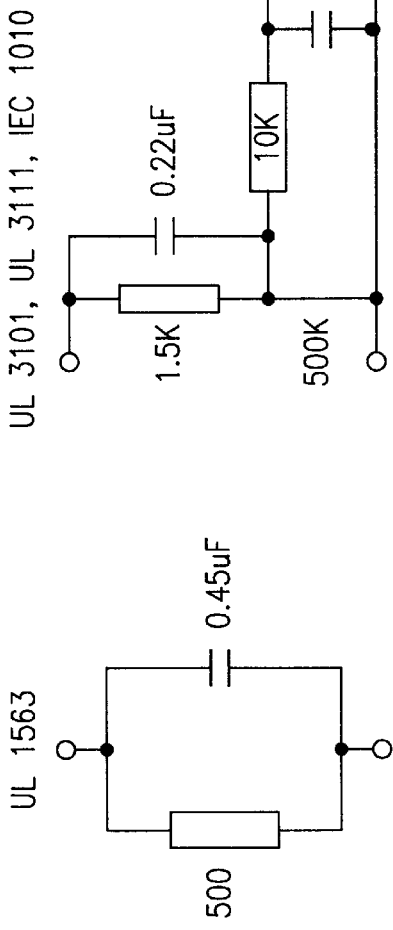
Figure 2A:
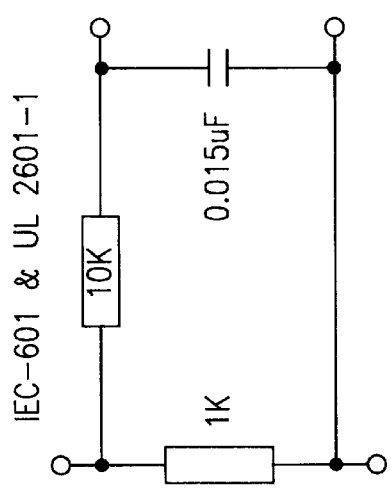
Figure 2E:
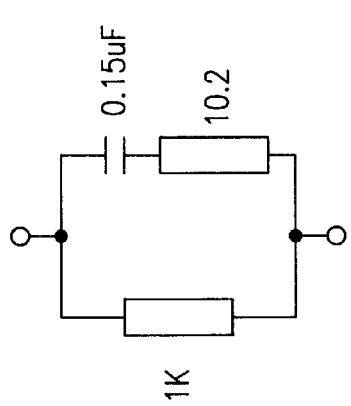
Figure 2D:
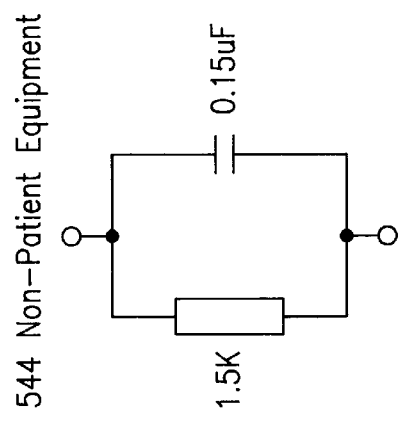

The circuit illustrated in FIG. 3 is capable of being switched to eight different test configurations depending on the states of switches 107–109, which correspond respectively to switches S2, S1, and S3 shown in FIG. 1. Switch 107 reverses the polarity of the power input-to-output connections, switch 108 disconnects the neutral input, and switch 109 connects the neutral input to the ground terminal 110 and third-wire ground contact 1050 of receptacle 105. While the three switches that achieve the eight configurations are known, their combination with the impedance circuit and external link switching is considered to be part of the present invention.

In addition to the power line switching matrix, the circuit illustrated in FIG. 3 provides five external inputs for supplying high voltages and/or currents to the device under test in order to perform dielectric withstand, insulation resistance, and ground bond tests. The external high voltage and high current/ground bond power supplies or test equipment form no part of the present invention, and may take any form, although the tester described in the above-cited copending U.S. patent application Ser. No. 09/033,958 is believed to be especially suitable because of its multiple test capabilities and compatible remote interface. The switching circuitry for the links to the external power supplies or test equipment, on the other hand, are considered to be an aspect of the present invention.

The five external inputs are a high voltage input 111 and a high current input 112 which are respectively connected by switches 113 and 114 to the line outputs 103,104 and to the ground circuit, the former input supplying a voltage higher than the normal operating voltage to the device under test in order to stress insulation in the device, and the latter input supplying a current to the ground circuit in order to measure the ground circuit impedance. High voltage/high current return jack 115 is also connected via switch 114 to chassis connection terminal 118. In addition, a switched external high voltage input 119 is connected via switch 120 to external output 121 to allow a high voltage to be applied to the device under test using a connection other than the line connection. A disconnect switch 123 disconnects the power line inputs and measuring device from the leakage current measuring probes in case a high voltage is being applied following a line leakage test while the probes are still in contact with the device under test.

The leakage current is measured between two probes 125 and 126, referred to respectively as the high probe (Probe Hi) and the low voltage probe (Probe Lo) which are connected to measurement device 127. Additional probe terminals 128 and 129 are also provided on the front of the instrument. Measurement device 127 can be connected to measure current between the probes, or the probes can be connected to the line input neutral or ground circuits by switching respective single pole double throw switches 130 and 131. Switches 130 and 131 respectively connect the high voltage probe 125 to the ground prong of the receptacle and the low voltage probe 126 to the neutral input to provide a third wire ground measurement mode when switches 130 and 131 are both closed, a probe-to-reference measurement mode when switch 130 is open and switch 131 is closed, and a probe-to-probe measurement mode when switches 130 and 131 are both open.

FIG. 4 is a functional block diagram of the preferred tester. Switches 107–109 are represented by functional block 202, labelled "line switch," which controls the connection between the AC power inputs 101,102 and receptacle 105 (shown only in FIG. 3). The external power inputs are indicated by functional block 201, and the probe switches by functional block 203. The measurement circuits include a differential amplifier circuit 204, an amplifier circuit 205, a detector circuit 206, and analog-to-digital converter 207. Also included are a digital-to-analog converter calibration circuit 208 and offset circuit 209, and a 10 V reference power supply 210. The main 24 V power supply for the relays is illustrated as functional block 2011.

Control signals to the power supply and measurement circuits are transmitted by a photocoupler 212 from a central processing unit 300, which also controls a display 301, keyboard 302, and remote interfaces 303 and 304, with an appropriate power supply 305. As illustrated in detail in FIG. 5, the measurement device 127 includes five impedance circuits 1270–1274 corresponding to the respective circuits shown in FIGS. 2A–2E, but in which each of the measurement circuits includes a respective relay 1275–1279 that determines which of the circuits is connected to the probes, with input to the relays being provided by inputs 1280–1284 from controller 300.

Figure 7:
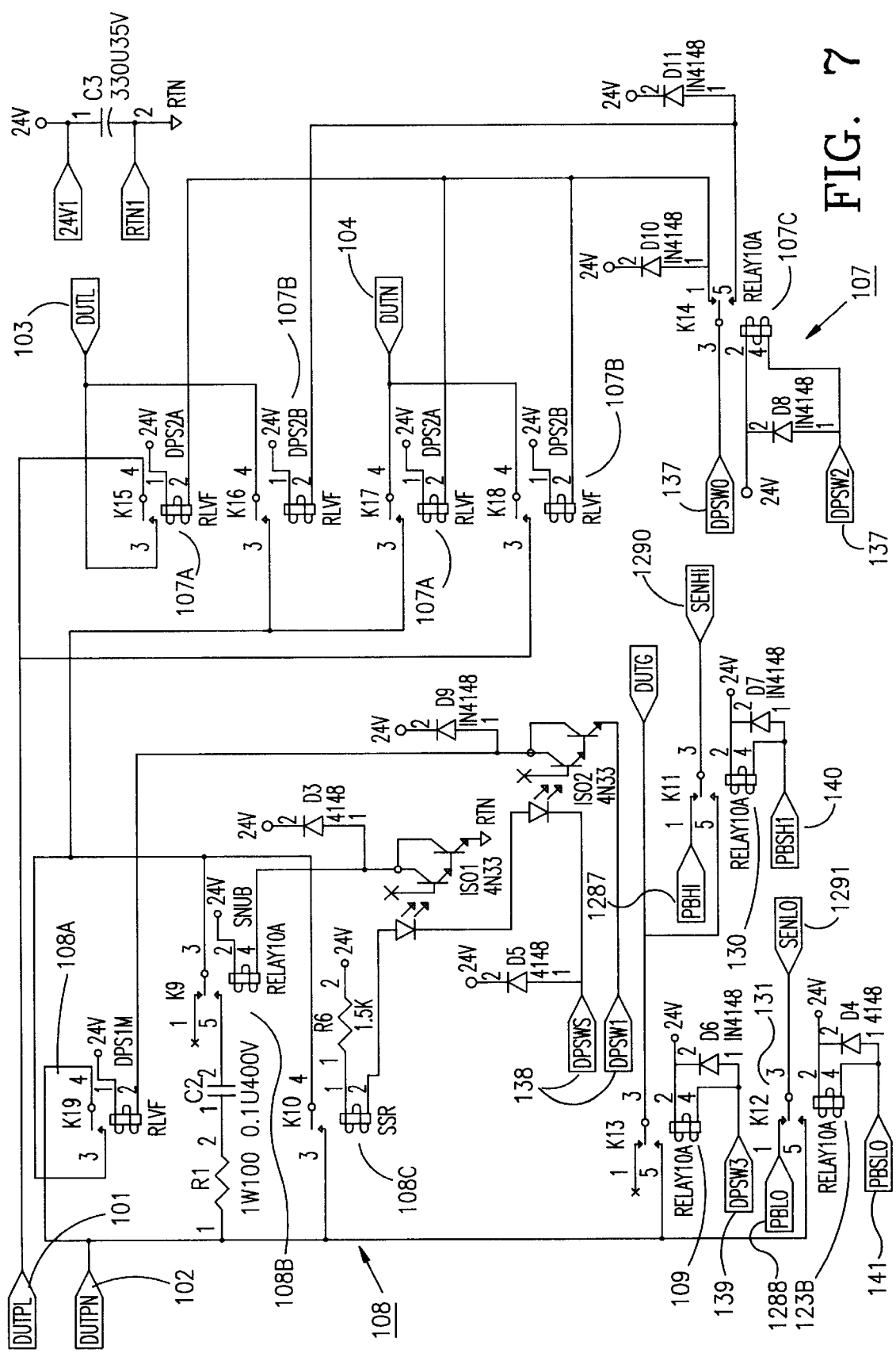
FIG. 7 is a schematic circuit diagram of an exemplary implementation of line and probe switching circuits for the preferred line leakage tester.
Figure 8:
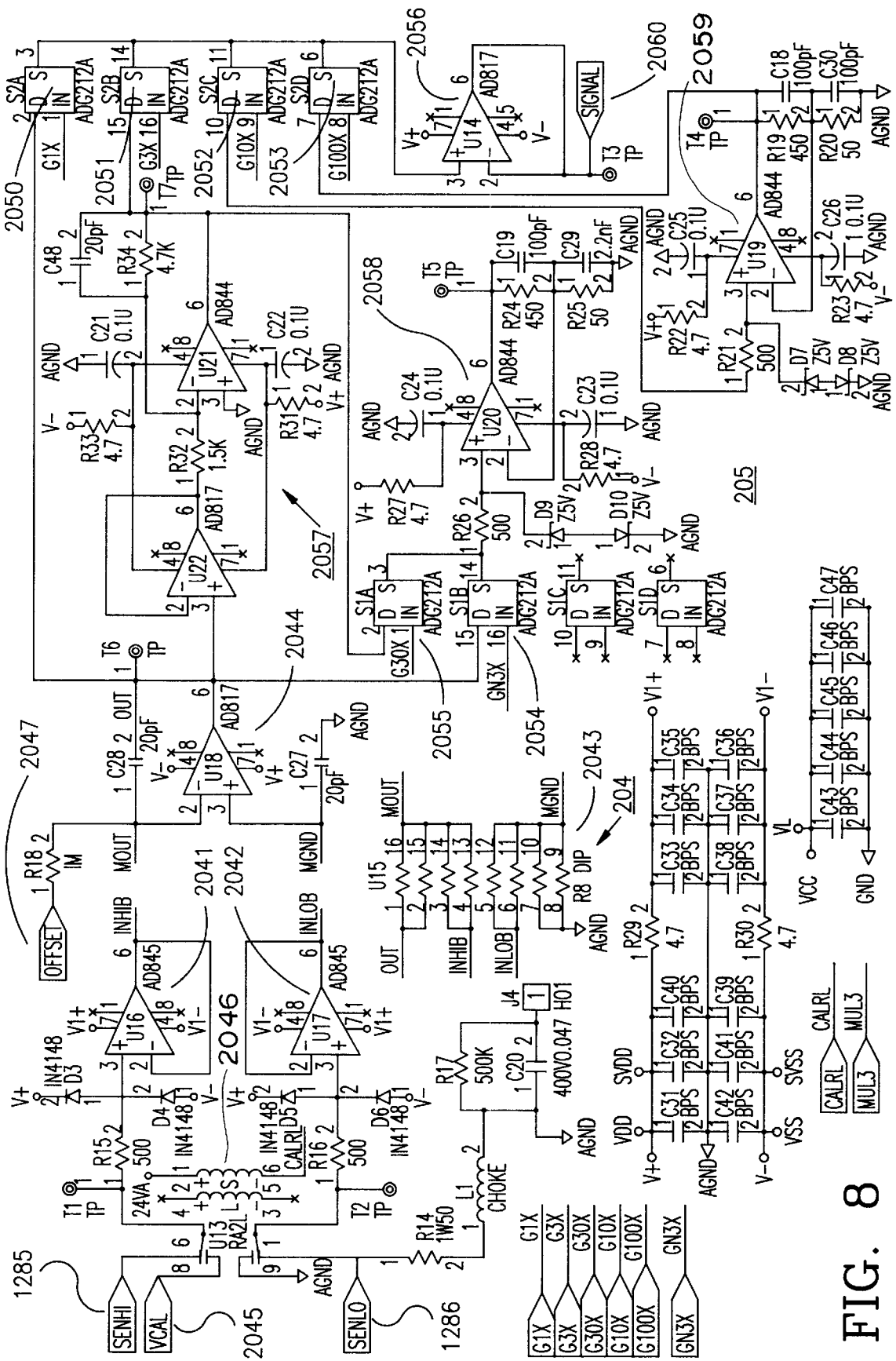
FIG. 8 is a schematic circuit diagram of a differential amplifier circuit for use in the line leakage tester of the preferred embodiment of the invention.

Connection of the probes to the measuring circuits is provided by terminals 1290 and 1291, which are respectively connected to probe input jacks 125 and 126 (FIG. 3) via inputs 1287 and 1288 and probe connection switches 130 and 131 (FIGS. 3 and 7). Connection between the respective high voltage inputs 1292 and low voltage outputs 1293 of the measurement circuits and differential amplifier circuit 204, shown in detail in FIG. 8, is provided by terminals 1285 and 1286. The measurement circuit also includes an overload detection circuit 1289.

In addition to the five human equivalent circuits, the circuit of FIG. 5 includes an external measurement device circuit 1294 that allows additional measurement circuits to be added externally to the instrument, the external measurement device circuit including a relay 1295 controlled by the processor via terminal 1296, and terminals 1297 and 1298 connected to jacks on the rear panel of the instrument to which the external measurement device may be connected. A jack 1299 is also included on the rear panel providing the return for the external measurement circuit, the return jack being connected to terminal 1286. By including a switchable connection to an external measuring device, additional test circuits can be added as the need arises, either because a new product is being tested or because the standards have changed.

Figure 6:
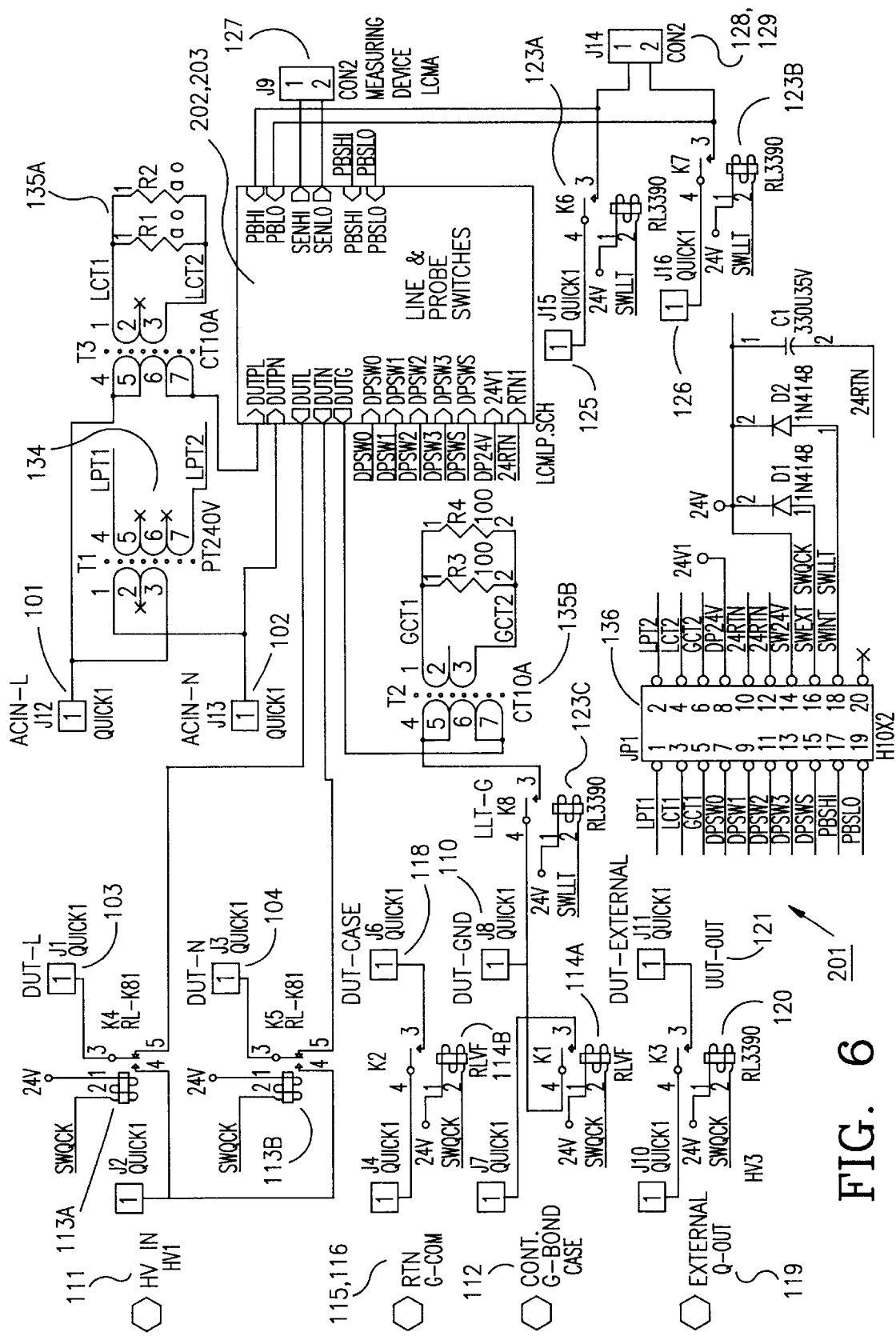
FIG. 6 is a schematic circuit diagram of an exemplary implementation of an external link switching circuit for the preferred line leakage tester.

FIG. 6 shows a specific implementation of portions of the switching circuit shown in FIG. 3 corresponding to external link switcher 201. The line switch circuit 202 and probe switch circuit 203 is represented in this figure by a single functional block, details of which are shown in FIG. 7.

External link switching circuit 201 includes a high voltage input 111, ground bond or continuity test input 112, high voltage and current return 115,116, external high voltage input 119, and switches 113A and 113B, which correspond to switch 1.13 shown in FIG. 3, switches 114A and 114B corresponding to switch 114 shown in FIG. 3, and switch 120. In this implementation, all of the external link switches are in the form of individual relays, but all of the relays are actuated by the same control signal SWQCK from the central controller, thereby permitting the high voltage test to be controlled entirely by the type of tester disclosed in the above-cited copending U.S. patent application Ser. No. 09/033,958, which provides a single control interface for insulation resistance, ground bond, and dielectric withstand tests. If separate instruments are needed for these tests, then the relays could be separately controlled. Also included in the circuit shown in FIG. 6 are relays 123A–123C corresponding to switch 123 for disconnecting the probe inputs 125 and 126 during a high voltage or current test, respective AC line and ground bond current monitoring circuits 134, 135A, and 135B, and connector 136 for the various power and control inputs to the circuit, and for the current monitoring outputs.

The line switch circuit 202 and probe switch circuit 203, both of which are shown in FIG. 7, includes relays 107A–107C corresponding to polarity reversing switch 107 of FIG. 3, line-to-output connection relays 108A–108C corresponding to switch 108, and ground connection switch 109, which is also in the form of a relay but for which does not require the isolation provided by the three power connection relays 108A–108C. Control inputs for the respective switches 107–109, 130, and 131 are provided by terminals 137–141, which are connected via connector 136 shown in FIG. 6 to the central processing unit and/or via processor controlled switches to the appropriate power supplies.

The detection circuitry includes, as shown in FIG. 4, a differential amplifier circuit 204. As illustrated in FIG. 8, circuit 204 includes op amps 2041 and 2042 and resistor/reference circuit 2043 for detecting the voltage levels of the respective probes, a comparator 2044 for measuring the difference between the outputs of the high probe 125 and low probe 126, between ground and neutral, or between the high probe 125 and neutral, depending on the states of switches 130 and 131, an offset input 2047 and comparator 2044 for zeroing the output of the probes so that it can be digitized by digitizer circuit 207 shown in FIGS. 4 and 9.

The output of the differential amplifier circuit is supplied to an adjustable gain amplifier circuit 205 having a gain determined by switches 2050–2055 which feed the output of comparator 2044 directly to op amp 2056, through a first amplifier circuit 2057, a second amplifier circuit 2058, the first and second amplifier circuits 2057 and 2058, the second amplifier circuit 2058 and a third amplifier circuit 2059, and the first through third amplifier circuits 2057–2059, based on inputs from the controller. Differential amplifier circuit 204 also includes a voltage calibration input 2045 from the DAC calibration circuit 208, which is alternatively supplied to the detection circuit via a relay 2046.

Figure 9:
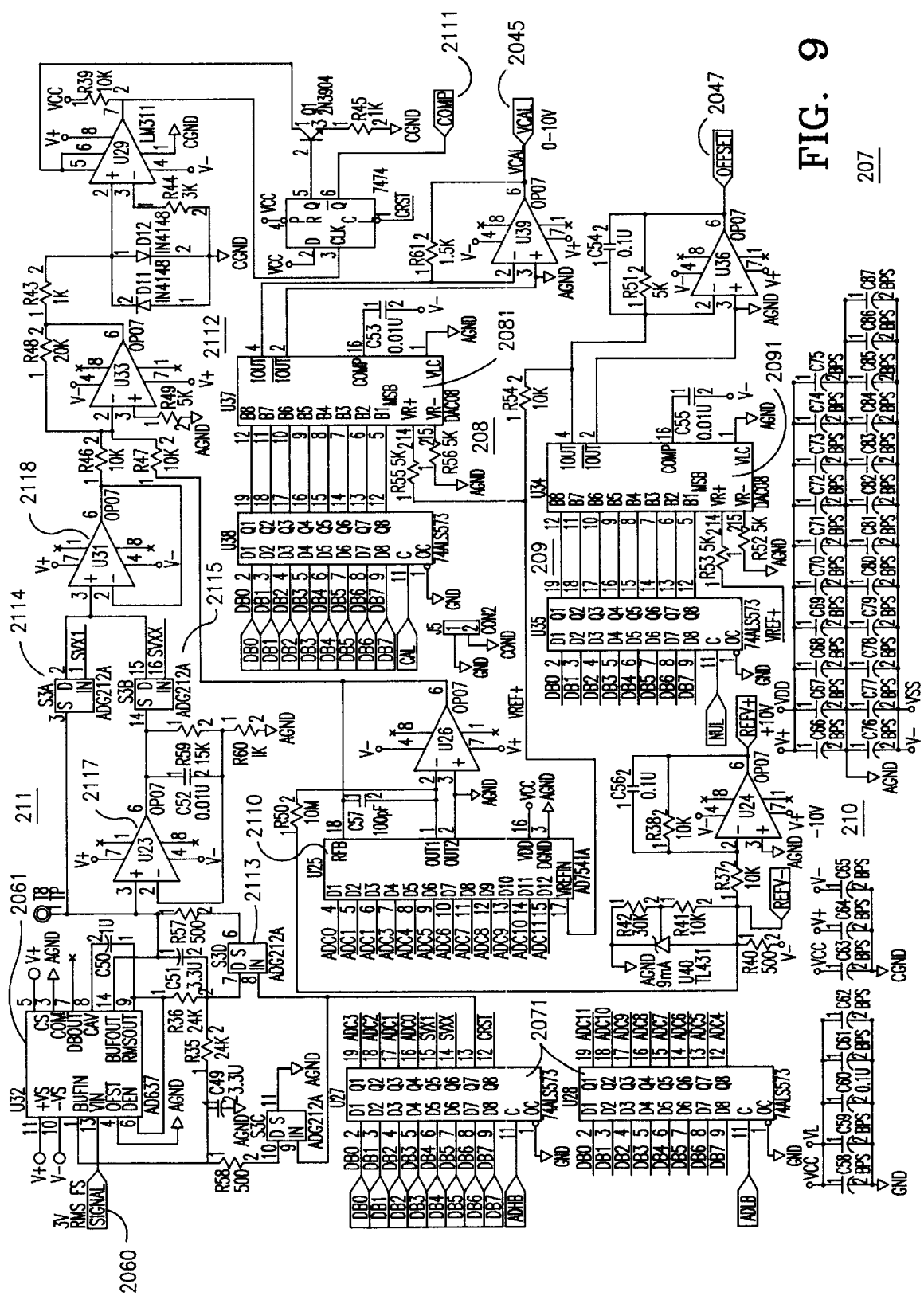
FIG. 9 is a schematic circuit diagram of the RMS detector and analog-to-digital conversion circuits for use in the line leakage tester of the preferred embodiment of the invention.

Both the DAC calibration circuit 208 and the DAC offset circuit 209, shown in detail in FIG. 9, include digital-to-analog converters 2081 and 2091 supplied with digital signals from the controller and with a reference voltage from reference voltage circuit 210. The analog output level of converter 2081 is determined by digital signals from the controller, and supplied to the amplifier input circuitry via DAC offset circuit output 2047, as described above, in order to zero the output of the probes, while the analog output of converter 2091 is supplied to the measurement circuitry via relay 2046 during calibration.

The zeroed and amplified output of the probes is supplied by buffer circuit 2061 to RMS detection circuitry 211. RMS detection circuitry 211 includes two stages formed by op amps 2117 and 2118, switching between one and two stage configurations being controlled by switches 2113–2114. The output of op amp 2118 of the RMS detection circuitry is compared by comparison circuitry 2112 to the output of digital-to-analog circuit 2110, in order to generate a digitized output 2111.

Figure 10:
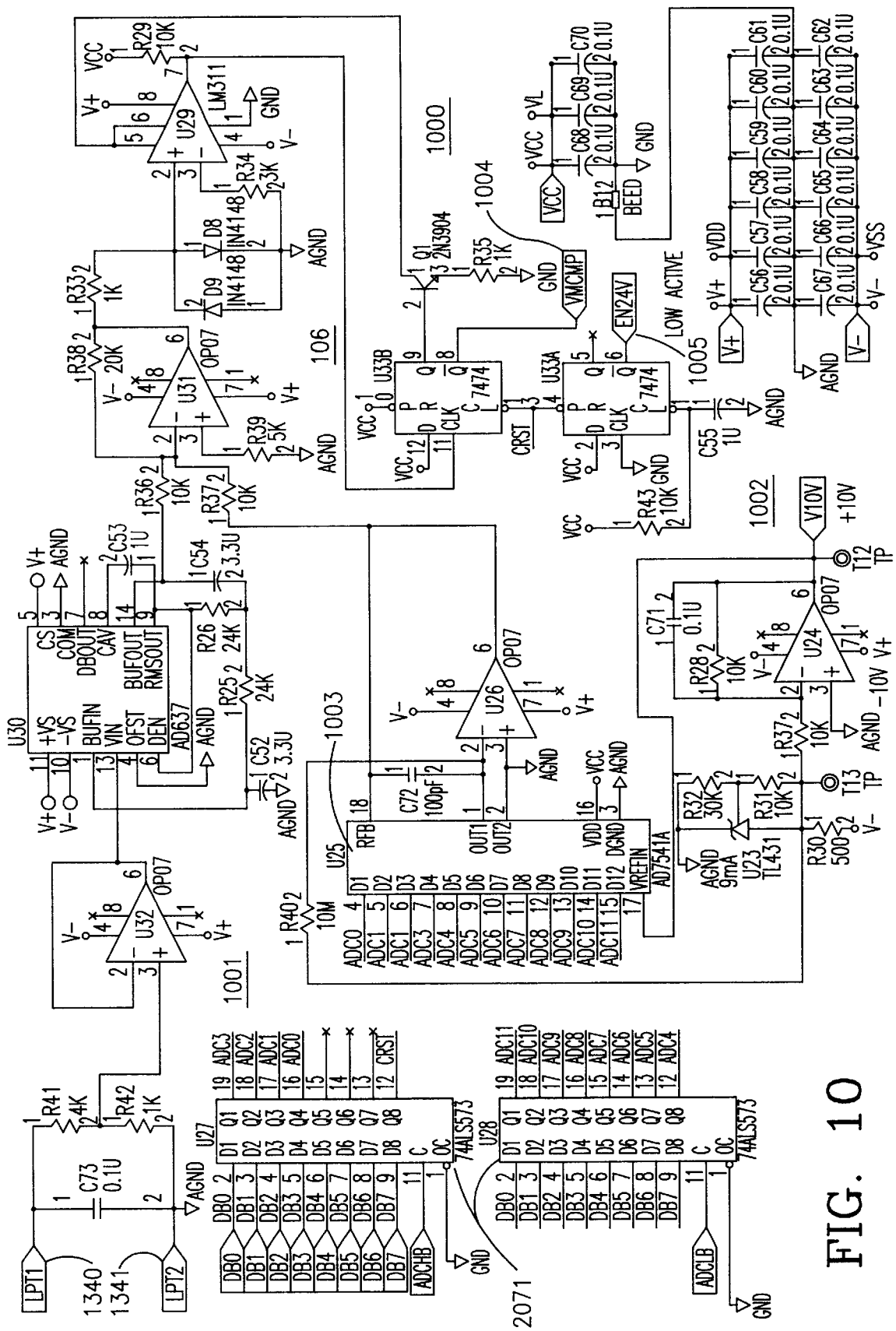
FIG. 10 is a schematic circuit diagram of an AC line voltage measuring circuit for use in the line leakage tester of the preferred embodiment of the invention.

FIG. 9 also shows digital interface circuits 2071 for supplying digital inputs to the digital-to-analog converter 2110 and a corresponding to digital-to-analog converter 1003 of the voltage monitoring circuit 1000, shown in FIG. 10. The output 2111 of the digitization circuitry is supplied directly to the controller for processing in order to control a display of the measured current and to cause the controller to trigger the appropriate visual and audible indicators in case the controller determines that an over-current has occurred.

As shown in FIG. 10, the outputs 1340,1341 of the AC line detection circuit 134 (shown in FIG. 6) are supplied to limit detection circuit 1000, which includes its own RMS detector 1001, voltage reference circuit 1002, and digital-to-analog converter 1003 for supplying an analog reference signal which is compared with the output of detector 1001, the outputs 1004 and 1005 of comparison circuit 106 being supplied directly to the control circuit, which monitors the voltage, controls an interlock, and causes an LED to illuminate and buzzer to sound in case an overvoltage is detected. In addition, the outputs 1350,1351 and 1352,1353 of the respective current monitoring circuits 135A and 135B shown in FIG. 6 are supplied to parallel overcurrent detection circuits 1354 and 1355, shown in FIG. 11, whose common output 1356 is also supplied directly to the controller in order to control the test instrument in order to prevent damage to the test equipment or hazards to the operator.

Microprocessor circuit 300, illustrated in block form in FIG. 4, may include a commercially available microprocessor such as the 8751 single-chip microcomputer available from Intel Corporation, details of which may be obtained directly from the manufacturer, as well as appropriate buffer and memory circuits, the details of which will be readily implemented by those skilled in the art based on the specifications of the microcomputer. These circuits are illustrated in FIGS. 12–16 in the interest of completeness, but only briefly described herein since the various digital control circuits and input/output circuits are not directly related to the principles of the invention, which concern the use of multiple human equivalent impedance circuits.

Figure 11:
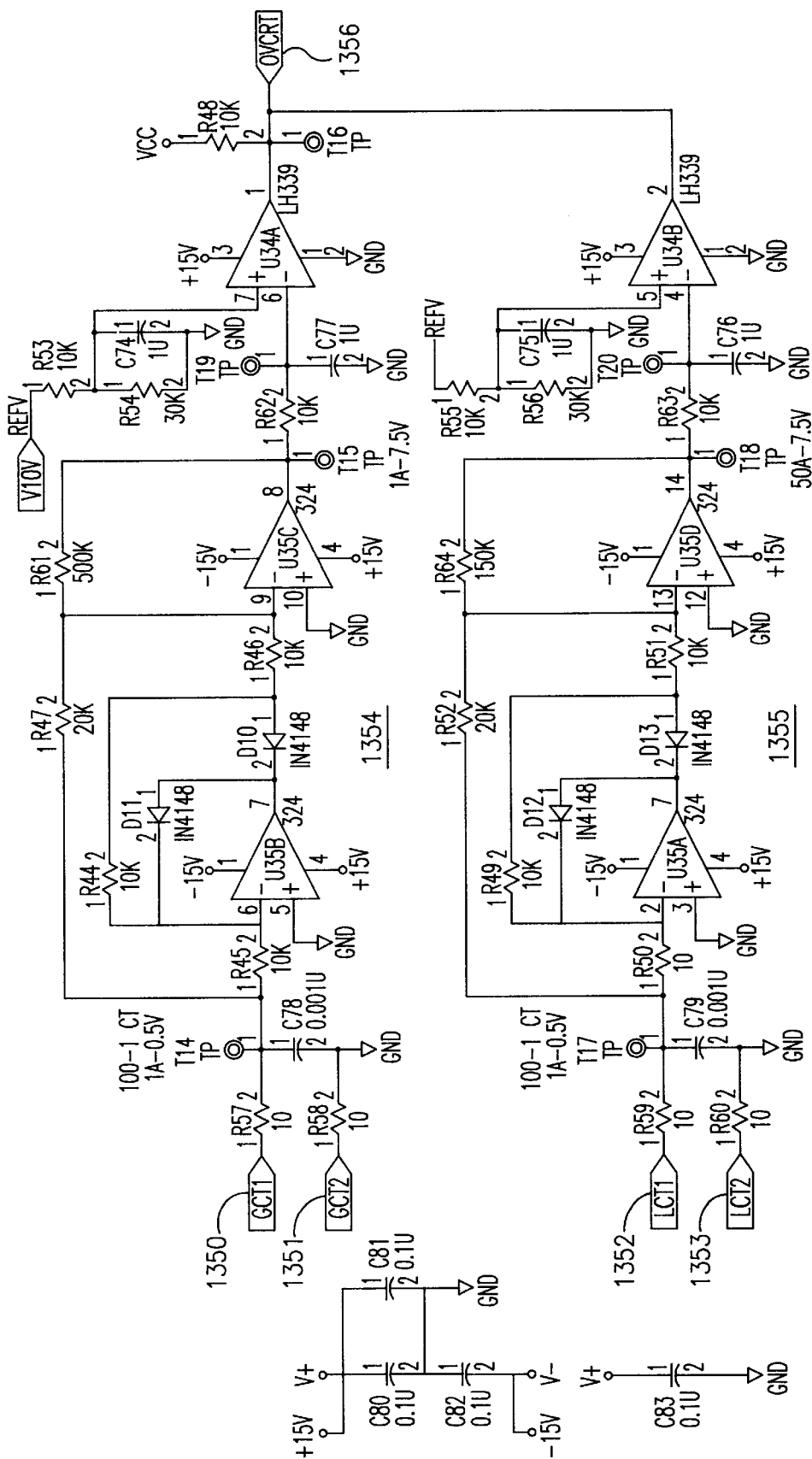
FIG. 11 is a schematic circuit diagram of over-current detection circuitry for use in the line leakage tester of the preferred embodiment of the invention.
Figure 12:
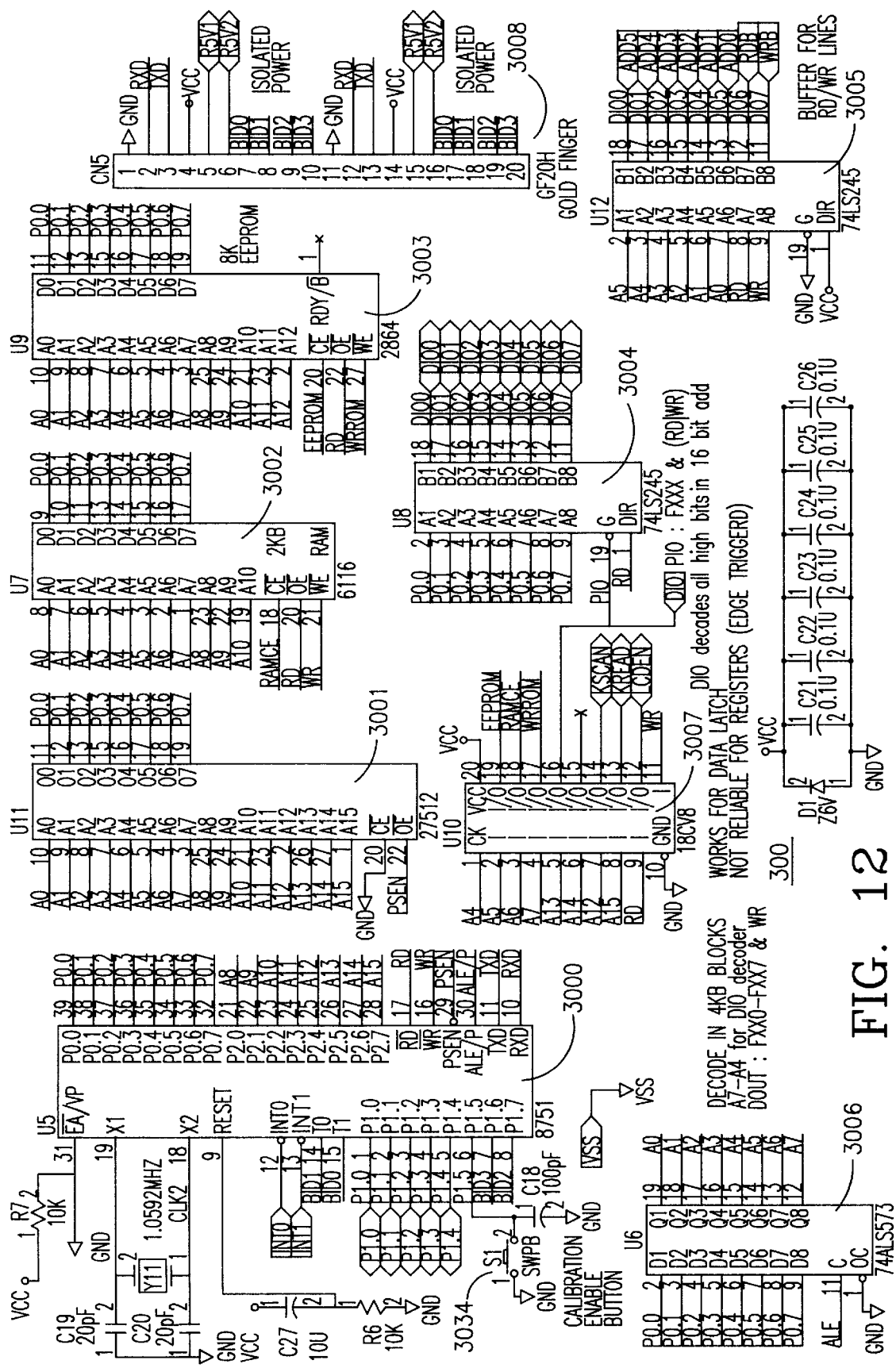
FIG. 12 is a schematic circuit diagram of the central processing unit of the line leakage tester of the preferred embodiment.
Figure 13:
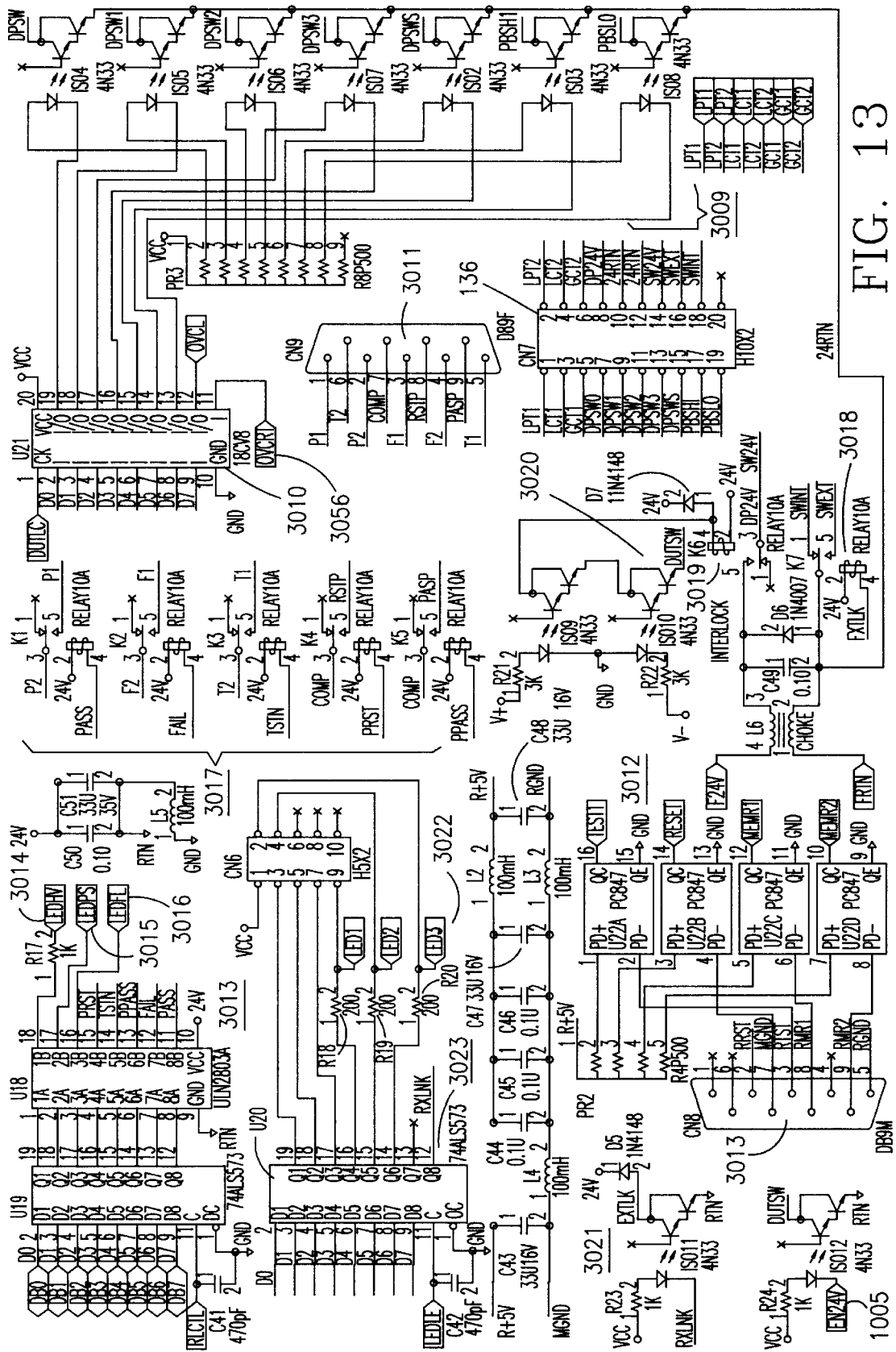
FIGS. 13–16 are schematic circuit diagrams of various portions of the digital controller of the line leakage tester of the preferred embodiment of the invention.

FIG. 12 shows details of microcomputer 300, including the above mentioned 8751 single chip microcomputer 3000, a 64 K 8-bit EPROM 3001, a 2 K 8-bit SRAM 3002, an 8 K 8-bit EEPROM 3003, 3 state octal bus transceivers 3004 and 3005, octal transparent latch 3006, memory input/output controller 3007, and Gold Finger power connector 3008. FIG. 13 shows the optical isolator interface 3009 to the line and probe switching circuit shown in FIG. 7, including a PLD controller 3010 controlled by the overcurrent detector output 3056 from the circuit shown in FIG. 11, a remote output D-Sub type connector 3011 which transmits pass, fail, and overvoltage or current test results to a remote controller, a remote input circuit 3012 including a D-Sub type input connector for permitting input of a test initiation signal, a reset signal, and two memory signals which initiate preset test programs stored in EEPROM 3001. FIG. 13 also shows a circuit 3013 for controlling a high voltage indicator LED 3014, a "pass" indicator LED 3015, and a fail indicator LED 3016, as well as for supplying corresponding signals to relay circuit 3017, which supplies the output signals to remote output connector 3011. In addition, FIG. 13 shows a relay 3018 which controls probe disconnect relays 123A and 123B of the external link switching circuit of FIG. 6 when an external high voltage input is connected and a power relay 3019 is switch on by interlock circuit 3020. Further interlocks are provided by circuit 3021, which are responsive to an external link receive signal and to the line current overvoltage detector output, and various status LEDs 3022 are controlled by circuit 3023.

Figure 14:
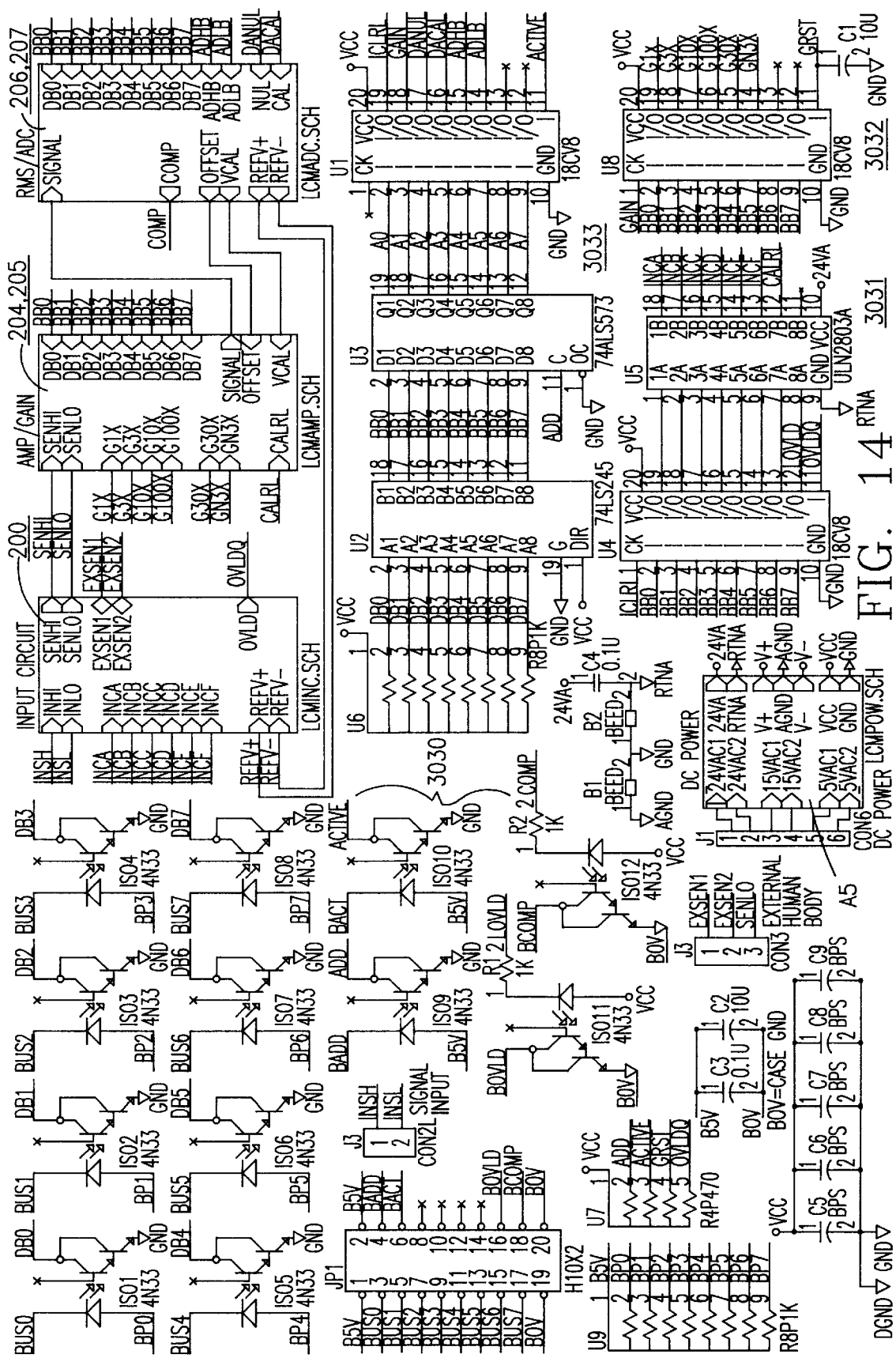

FIG. 14 shows the data interface portion 3030 of the optical isolator circuit 212, including the interface circuit 3031 for the impedance circuit selection signals supplied to the circuit shown in FIG. 5, the gain control interface 3032 for the amplifier circuit shown in FIG. 8, and an interface circuit 3033 for supplying various control signals to the digital-to-analog converter, including a calibration control signal initiated by a switch 3034, shown in FIG. 12, connected to microcomputer 3000. For convenience, the input output signals for circuits 200 and 204–207, which are illustrated in detail in FIGS. 5, 8, and 9, are indicated at the top of FIG. 14.

Figure 15:
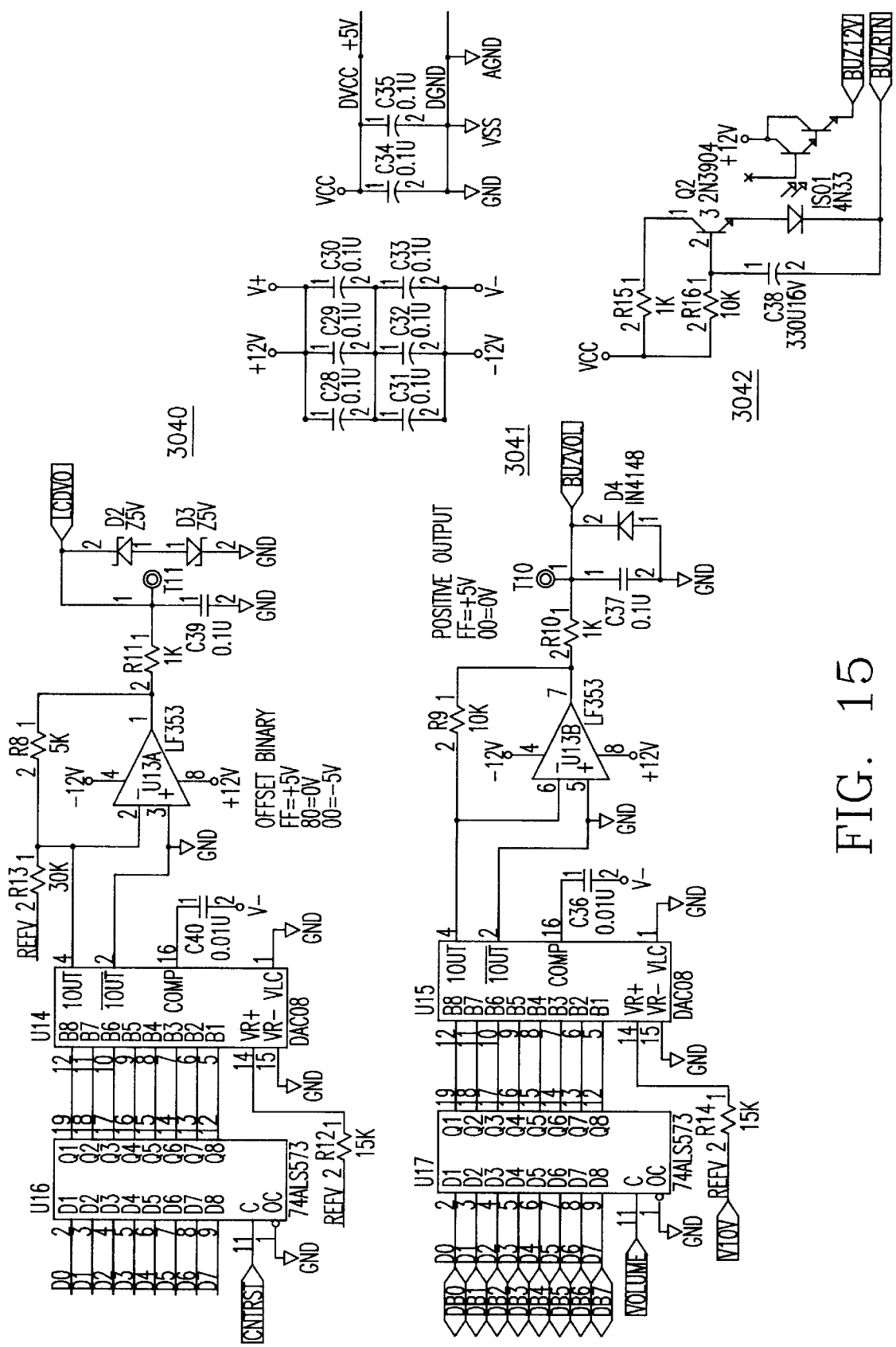
Figure 16:
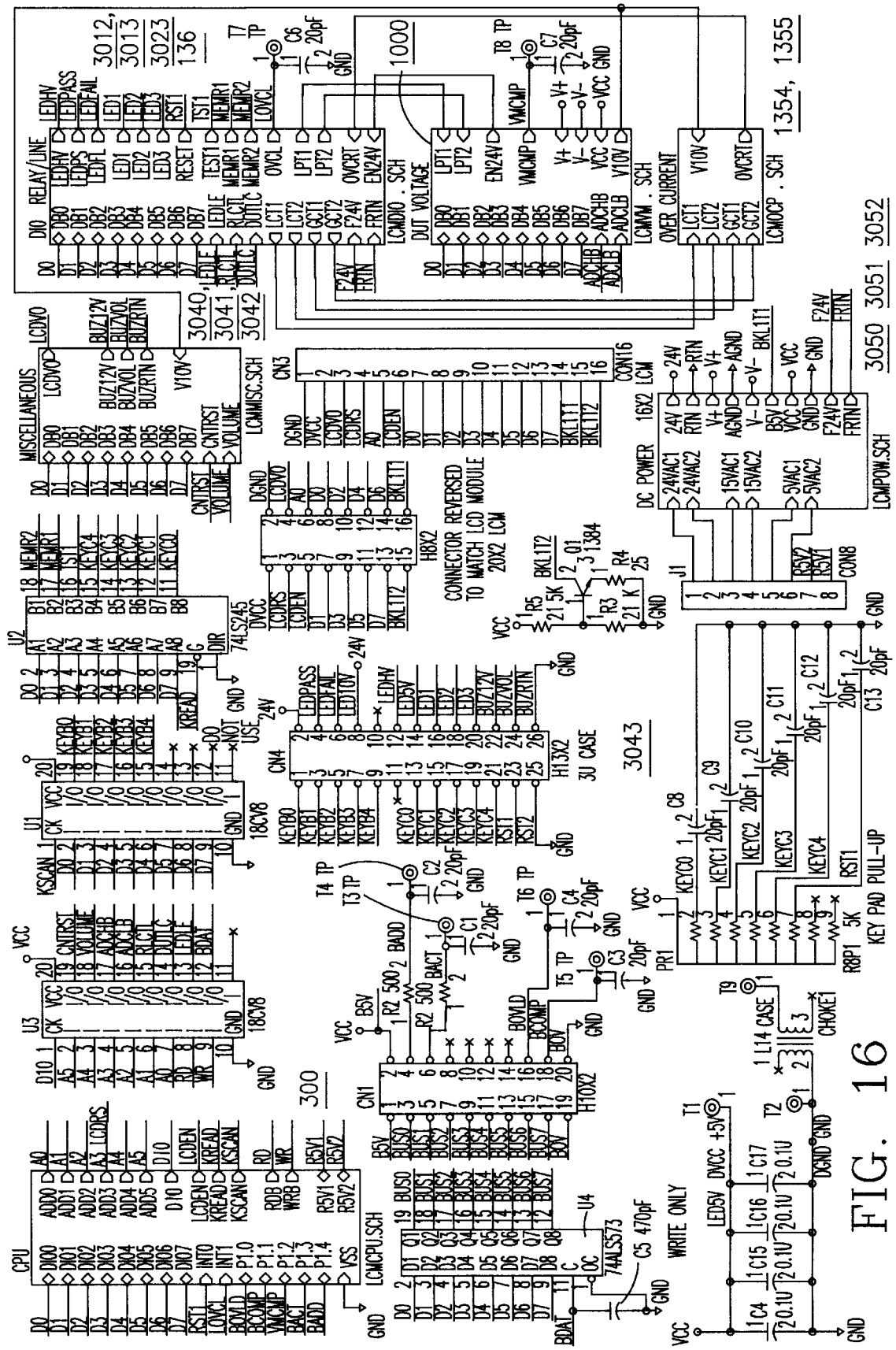
Figure 17:
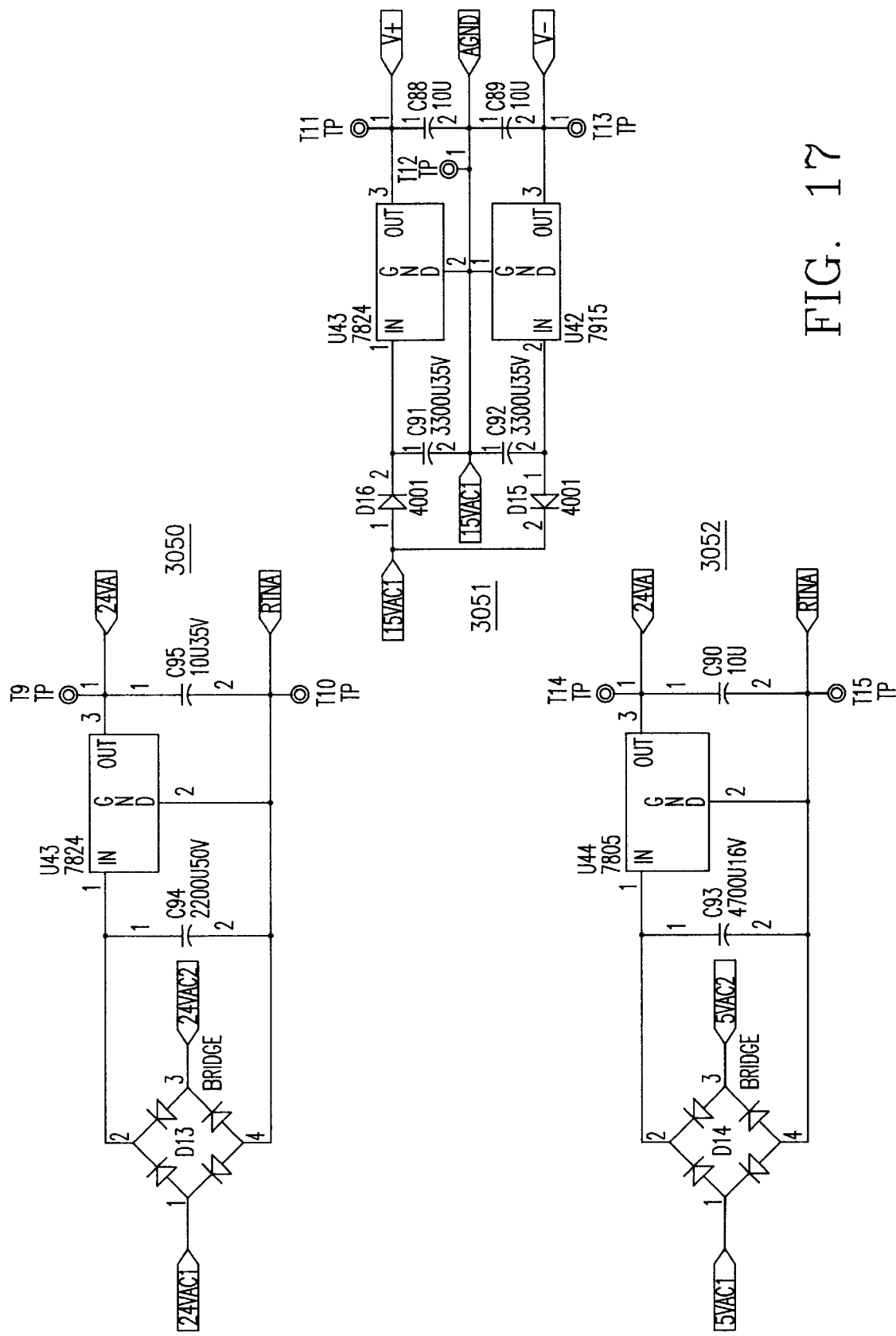
FIG. 17 is a schematic circuit diagram of a power supply circuit for use in the line leakage tester of the preferred embodiment of the invention.

Finally, FIG. 15 shows an LCD display voltage control circuit 3040, a buzzer volume control circuit 3041, and a buzzer power supply circuit 3042, and FIG. 16 shows controller input/output circuits for the LCD display, keypad and data bus (collectively numbered as circuit 3043), as well as blocks indicating the input/output configurations for the controller 300, indicator circuits 3040–3042 shown in FIG. 15, LED, remote, and jumper/connector circuits 136, 3012, 3013, and 3023 shown in FIG. 13, voltage measuring circuit 1000 shown in FIG. 10, over-current detection circuits 1354,1355 shown in FIG. 11, and DC power supply circuits 3050–3052, details of which are shown in FIG. 17.

Figure 18A:
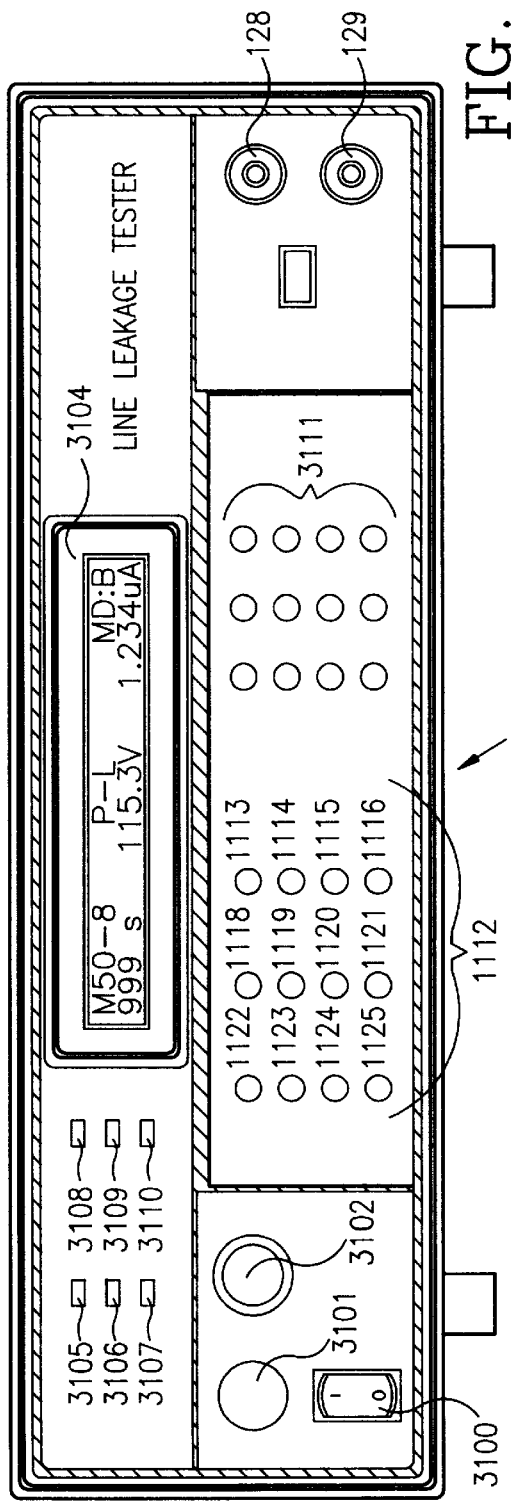
FIG. 18A is a plan view of a front panel arrangement for the line leakage tester of the preferred embodiment.
Figure 18B:
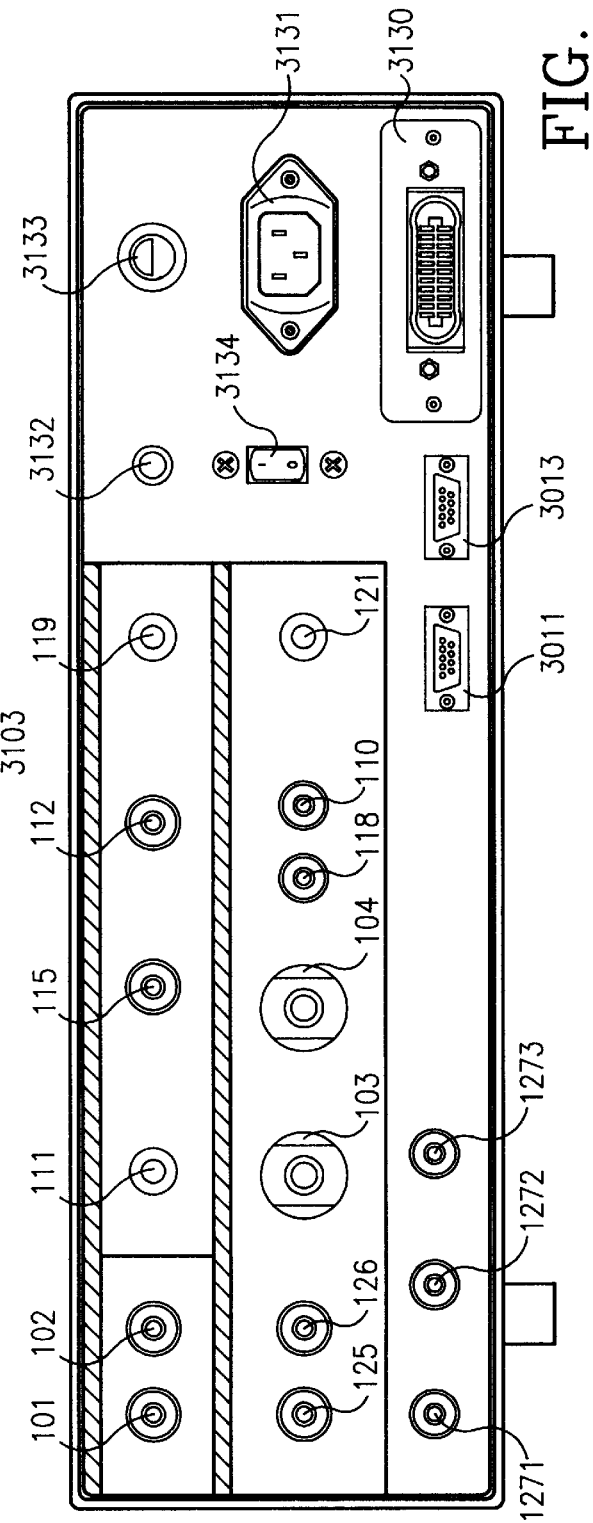
FIG. 18B is a plan view of a rear panel arrangement for the line leakage tester of the preferred embodiment.

FIGS. 18A and 18B illustrate a possible configuration of the front and rear panels of a line tester that includes the circuitry shown in FIGS. 4–17. The front panel supports a main power switch 3100, a reset button 3101, and a test initiation button 3102, which may be illuminated by corresponding LEDs. Also included are front panel high and low probe jacks 128 and 129, a keypad 3103, an LCD display 3104, and LED indicators 3105–3110 for respectively indicating the presence of a remote bus connection, the activation of a programming lock function, the presence of an external link, and the configuration of the line switches shown in FIGS. 3 and 6.

Keypad 3103 includes various function and number keys for programming test parameters such as delay time and current, and for selecting the impedance circuits shown in FIG. 5. The delay time setting is used to program the amount of time that may be needed to delay the trip current detection function until the device under test has reached proper operating conditions. For example, included in the illustrated keypad are numeric keys 3111 and function keys 1112 for selecting menus which control setting of the switches shown in FIG. 3, and which are displayed on the LCD screen to prompt the entry of appropriate test settings and parameters. The trip point menu is selected by function key 3113, a delay in starting the test two point judgement by function key 3114, with entry and exit from the programming mode being controlled by function keys 1115 and 1116. The line settings menu is initiated by function key 1118, the probe settings menu by function key 1119, the equivalent circuit selection menu by function key 1120, and the external and step connection menu by function key 1121. In addition, a lock key 1124 is used to toggle a function which prevents changing of test parameter settings, and may be activated or deactivated in response to entry of a password following pressing of the lock key, while a memory key 1122 is used to access a particular memory location to recall pre-stored test parameters, a step key 1124 is included to show the test parameters of the functions selected for a particular step of a stored test program, and a local key 3125 allows selection of remote or local operation. Those skilled in the art will of course appreciate that the exact layout and types of keys can be varied in numerous ways while still enabling a user to select desired parameters for the various tests.

The exemplary rear panel shown in FIG. 18B includes line and neutral inputs 101 and 102, high voltage input 111, high voltage/high current return 115, current output 112, and high voltage return/external input 119. In addition, the rear panel includes probe inputs 125 and 126, line and neutral outputs 103 and 104, ground and chassis connections 110 and 118, and external output 121. The external measuring device connections, which are respectively connected to inputs 1297 and 1298 shown in FIG. 5, and connector 127 shown in FIG. 7, include voltage and current outputs 1271 and 1272, and return 1273. Also included on the rear panel are remote input and output connectors 3011 and 3013, bus interface connector 3130, power line connector 3131, ground 3132, fuse holder 3133, and 115/220 V selector switch 3134. The input transformer for the instrument has not been shown but may be similar to the one shown in copending application Ser. No. 09/033,958, which also provides details of suitable bus interfaces.

It will of course be appreciated by those skilled in the art that the principles of the invention are not limited to five internal and one external measurement circuits. The number of measurement circuits can be any number greater than or equal to two, so long as the instrument provides for switching of the measurement circuits in response to commands from a central controller, and the types of measurement circuits included may be varied depending on the types of products to be tested and the jurisdictions in which the tester is to be used. In addition, while the power line switching matrix, external link circuitry, and probe switching circuitry of the preferred embodiment are especially advantageous, none are essential to the broadest principles of the invention, and all may be varied or eliminated without departing from the scope of the invention. Similarly, while the use of a single controller and operator interface for all of the different functional elements of the preferred tester is believed to be particularly advantageous, it is within the scope of the invention to use other types of controllers and operator interfaces.

As a result, although a preferred embodiment of the invention in sufficient detail to enable those skilled in the art to make and use the invention, it will nevertheless be appreciated that numerous variations and modifications of the illustrated embodiment may be made without departing from the spirit of the invention, and it is intended that the invention not be limited by the above description or accompanying drawings, but that it be defined solely in accordance with the appended claims.

I claim:

1. A line leakage tester, comprising:
 a power switching circuit arranged to supply power to a device under test;
 a probe arranged to contact the device under test while power is being supplied thereto;
 a plurality of human equivalent impedance circuits connected between the probe and a reference;
 a measurement circuit arranged to measure leakage current present in one of said impedance circuits when said probe contacts the device under test while power is being supplied thereto; and
 a switch circuit arranged to disconnect said one of said impedance circuits from said probe and to connect another of said impedance circuits to said probe so that a different line leakage test can be performed.

2. A line leakage tester as claimed in claim 1, further comprising a central controller coupled to a display and to an operator interface including an input device arranged to permit different ones of said impedance circuits to be selected via said operator interface.

3. A line leakage tester as claimed in claim 2, wherein said switch circuit- includes a plurality of relays connected between said probe and said impedance circuits, said relays being actuated based on signals from said controller.

4. A line leakage tester as claimed in claim 2, further comprising a second probe, said impedance circuits being connectable by means of switches between said first and second probes.

5. A line leakage tester as claimed in claim 4, wherein said switches include a first switch connected between a first terminal of said measurement device, a first of said probes, and a neutral line input to said tester, and a second switch connected between a second terminal of said measurement device, a second of said probes, and ground, said first and second switches being operable by the controller to enable selection via said operator interface of a probe-to-probe, ground-to-neutral, or probe-to-neutral leakage current measurement configuration.

6. A line leakage tester as claimed in claim 2, wherein said power switching circuit includes a line input, a neutral input, a line output, and a neutral output, said line input and neutral input being connected to a power source and said line output and neutral output being connected to the device under test, and further comprising respective switches for reversing a polarity of connections from said line input and neutral input to said line output and neutral output, for disconnecting said neutral input from said neutral or line outputs, and for selectively connecting said neutral input to ground, said switches being connected to said controller to enable configuration of the power supply connections to said device under test via said operator interface.

7. A line leakage tester as claimed in claim 6, further comprising an external high voltage input and means for selectively connecting said high voltage input to said line and neutral outputs, and for simultaneously disconnecting said line output from said line input.

8. A line leakage tester as claimed in claim 7, further comprising a safety interlock for disconnecting said probe from said impedance circuits and said measurement circuit when said line and neutral outputs are connected to said high voltage input.

9. A line leakage tester as claimed in claim 8, further comprising a high voltage return connectable via a further switch to a case of the device under test.

10. A line leakage tester as claimed in claim 2, further comprising an external link between a ground connection to the device under test and a current source, and between a ground path return from the device under test and a return of the current source, said external link being established by a switch connected to said controller so as to be operable via said operator interface.

11. A line leakage tester as claimed in claim 1, further comprising a second probe, said impedance circuits being connectable by means of switches between said first and second probes.

12. A line leakage tester as claimed in claim 11, wherein said switches include a first switch connected between a first terminal of said measurement device, a first of said probes, and a neutral line input to said tester, and a second switch connected between a second terminal of said measurement device, a second of said probes, and ground, said first and second switches being operable by the controller to enable selection via said operator interface of a probe-to-probe, ground-to-neutral, or probe-to-neutral leakage current measurement configuration.

13. A line leakage tester as claimed in claim 1, further comprising an external high voltage input and means for selectively connecting said high voltage input to said line output, and for simultaneously disconnecting said line output from said line input, and further comprising a safety interlock for disconnecting said probe from said impedance circuits and said measurement circuit when said line output is connected to said high voltage input.

14. A line leakage tester as claimed in claim 1, further comprising a central controller, and wherein said measurement circuit comprises a differential amplifier connected between said probe and said reference, a variable gain amplifier connected to an output of said differential amplifier, an RMS DC level detector connected to an output of said variable gain amplifier, and an analog-to-digital converter connected to an output of said RMS DC level detector and to said central controller.

15. A line leakage tester as claimed in claim 14, wherein said differential amplifier comprises a plurality of amplifier circuits having different gain characteristics, and a plurality of relays operable by said central controller to selectively connect different ones of said amplifier circuits to said differential amplifier and said analog-to-digital converter.

16. A line leakage tester as claimed in claim 14, wherein said analog-to-digital converter includes means for comparing an output of said DC level detector with an analog output of a digital-to-analog converter supplied with digital signals from said central controller, an output of said comparing means being supplied to and processed by said central controller in order to provide a display of leakage current.

17. A line leakage tester as claimed in claim 14, wherein said central controller is arranged to cause shut-down of a test and an audible, visual, or audible and visual alarm to be activated upon determination by the central controller that an over-current condition has occurred.

18. A line leakage tester as claimed in claim 17, further comprising a line voltage detector arranged to detect a voltage being supplied to the device under test and to output a line voltage signal to the central controller, and a current level detector for providing an over-current protection signal to the central controller.

19. A line leakage tester as claimed in claim 1, further comprising an external connection arranged to enable an additional human equivalent impedance circuit to be selectively connected between said probe and said reference in place of said plurality of impedance circuits.

20. A line leakage tester as claimed in claim 1, wherein said power switching circuit includes a line input, a neutral input, a line output, and a neutral output, said line input and neutral input being connected to a power source and said line output and neutral output being connected to the device under test, and further comprising respective switches for reversing a polarity of connections from said line input and neutral input to said line output and neutral output, for disconnecting said neutral input from said neutral or line outputs, and for selectively connecting said neutral input to ground, said switches being connected to said controller to enable configuration of the power supply connections to said device under test in any desired sequence.

21. A line leakage tester as claimed in claim 1, further comprising a microprocessor controller and a bus interface enabling the microprocessor controller to be programmed remotely to select one of said impedance circuits.

* * * * *